United States Patent
Yamamoto (10) Patent No.: US 6,630,393 B2
(45) Date of Patent: Oct. 7, 2003

(54) SEMICONDUCTOR DEVICE MANUFACTURING METHOD AND SEMICONDUCTOR DEVICE MANUFACTURING BY THE SAME METHOD

(75) Inventor: Ichiro Yamamoto, Tokyo (JP)

(73) Assignee: NEC Electronics Corporation, Kanagawa (JP)

(*) Notice: Subject to any disclaimer, the term of this patent is extended or adjusted under 35 U.S.C. 154(b) by 23 days.

(21) Appl. No.: 09/782,293

(22) Filed: Feb. 14, 2001

(65) Prior Publication Data

US 2001/0018254 A1 Aug. 30, 2001

(30) Foreign Application Priority Data

Feb. 14, 2000 (JP) ........................................ 2000-035459

(51) Int. Cl.[7] .............................................. H01L 21/31
(52) U.S. Cl. ........................................ 438/591; 438/287
(58) Field of Search ................................ 438/216, 287, 438/591, 785, FOR 202

(56) References Cited

U.S. PATENT DOCUMENTS

| | | | | |
|---|---|---|---|---|
| 5,403,434 A | * | 4/1995 | Moslehi ........................ 134/1.2 |
| 5,834,060 A | * | 11/1998 | Kawahara et al. ..... 427/255.32 |
| 5,891,798 A | * | 4/1999 | Doyle et al. ................. 438/624 |
| 6,001,741 A | * | 12/1999 | Alers .......................... 438/706 |
| 6,020,024 A | * | 2/2000 | Maiti et al. ............... 427/248.1 |
| 6,066,196 A | * | 5/2000 | Kaloyeros et al. ......... 106/1.18 |
| 6,191,054 B1 | * | 2/2001 | Ohtsuka et al. ............. 427/124 |
| 6,236,559 B1 | * | 5/2001 | Uchikawa et al. ..... 106/287.18 |
| 6,312,526 B1 | * | 11/2001 | Yamamuka et al. ........ 118/506 |
| 6,316,796 B1 | * | 11/2001 | Petersen et al. ............ 200/329 |
| 6,335,049 B1 | * | 1/2002 | Basceri ........................ 427/79 |
| 6,470,144 B1 | * | 10/2002 | Tarutani et al. ............. 392/396 |
| 2001/0050028 A1 | * | 12/2001 | Itsuki et al. ................ 106/1.22 |

OTHER PUBLICATIONS

Wolf S. "Silicon Processing for the VLSI–ERA: vol. 2—Process Integration", 1990, Lattice Pr., vol. 2, pp. 323, 327–334.*

* cited by examiner

Primary Examiner—George Fourson
Assistant Examiner—Suk-San Foong
(74) Attorney, Agent, or Firm—Young & Thompson (57) ABSTRACT

A method for manufacturing a high dielectric constant insulating film made of a metal oxide on a silicon substrate is provided using a material gas mixture containing an oxidizing agent without forming silicon oxide layer on a silicon substrate. The manufacturing method includes the steps of placing the semiconductor substrate into a reaction chamber; introducing an organic metal material, oxidizing agent, and a material having a reducing action; and forming a high dielectric constant gate insulating film on the semiconductor substrate by a chemical reaction in the reaction chamber.

12 Claims, 8 Drawing Sheets

SEMICONDUCTOR DEVICE MANUFACTURING METHOD AND SEMICONDUCTOR DEVICE MANUFACTURING BY THE SAME METHOD

BACKGROUND OF THE INVENTION

1. Field of the Invention

The present invention relates to a semiconductor device manufacturing method and a semiconductor device manufactured by the same method, and particularly relates to a method for manufacturing a semiconductor device having a high dielectric gate insulating film made of metal oxide and a semiconductor device manufactured by the same method.

2. Background Art

An MIS (Metal Insulator Semiconductor)-type transistor, which is operated by use of either electrons or holes as carriers, is known as one type of semiconductor devices.

Figure 9:
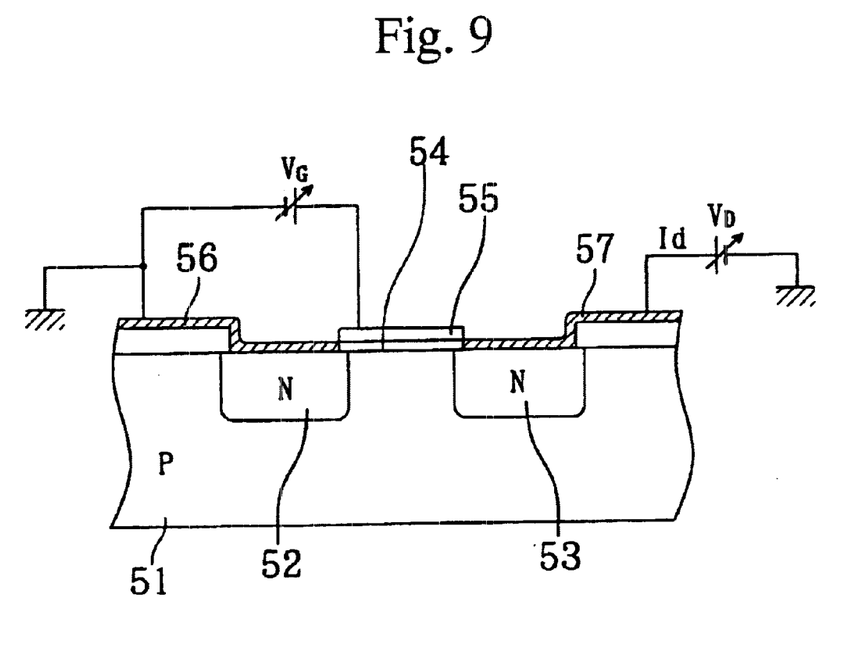
FIG. 9 is a cross-sectional diagram showing the structure of an MIS-type semiconductor device, which is an object of the present invention.

With reference to FIG. 9, in a MIS-type transistor, a gate electrode 55 is formed through a gate insulating layer 54 on both an N-type source region 52 and a drain region 53 formed on a P-type semiconductor substrate 51, and a source electrode 56 and a drain electrode 57 are formed respectively on the source region 52 and drain region 53. This type of transistor is operated by the operating principle that a drain current Id flowing through both regions 52 and 53 is controlled by controlling the concentration of a carrier induced in a channel directly beneath the gate insulating film 54 by a control voltage (gate voltage) VG applied to the gate electrode 55.

Here, the MOS (Metal Oxide Silicon) type transistor using silicon as a semiconductor substrate and silicon oxide as a gate insulating film 54 is widely adopted as a constituent element for LSI (Large Scale Integrated) circuits because of its simple structure and ease of producing large-scale integrated circuits.

In semiconductor devices having the above-described gate insulating film or the gate oxide film, a fundamental condition for improvement in the performance of the semiconductor devices with respect to operating speed and operating capacity is an increase in the drain current. The drain current Id is shown by the following equation.

$$Id \propto ACox \quad (1)$$

where, A represents a proportional constant, and Cox represents the capacitance of the gate insulating film.

The capacitance of the gate oxide film Cox is expressed by the following equation (2).

$$Cox \propto \epsilon ox/tox \quad (2)$$

where, $\epsilon$ ox represents the dielectric constant of the gate oxide film and tox represents the thickness of the gate oxide film.

As is clearly shown in Equation (1), the drain current Id can be increased by increasing the capacitance Cox of the gate insulating film and the capacitance Cox can be increased by forming a thin gate oxide film, as shown in the equation (2).

Thus, conventionally, in a semiconductor device having the gate oxide film, the oxide film is formed thinner with the aim of improving the performance of the semiconductor device.

However, when the thickness tox of the gate oxide film is too thin, a gate leak current flows through this very thin gate oxide film; therefore the thickness of the gate oxide film is limited so that the gate leak current can be prevented. In general, it is known that, when the thickness of the gate insulating film is less than 3 nm, the gate leak current begins to flow, and when the thickness of the gate insulating film becomes less than 1.5 nm, a limit is reached for normal operating performance of the semiconductor device.

As shown by Eqaution (2), it is anticipated that the performance of this type of semiconductor device can be improved by forming an insulating film with a higher dielectric constant than that of the oxide film (dielectric constant is 3.8 to 4.1), in addition to forming the thin gate oxide film. Metal oxides such as zirconium oxide (the dielectric constant $\epsilon$ is 10 to 20) are known to have higher dielectric constants, and thus it is possible to produce insulating films with a higher dielectric constant by use of metal oxides having a dielectric constant higher than that of silicon oxide.

The performance of the semiconductor device can be improved by forming the gate insulating film by use of a material having a high dielectric constant while depositing the film within a thickness range, which allows the prevention or reduction of the generation of a gate leak current.

Figure 11:
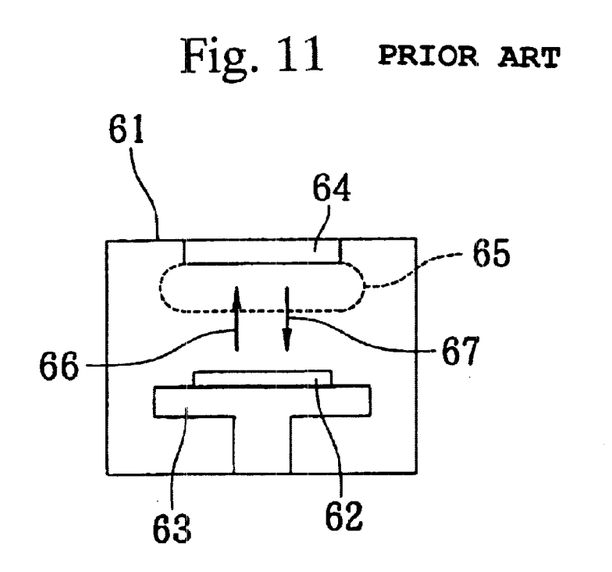
FIG. 11 is a schematic representation showing a conventional method of forming a high dielectric constant insulating film by a sputtering method in the manufacturing process of a semiconductor device.

Two representative methods are conventionally known for forming an insulating film having a high dielectric constant for manufacturing a semiconductor device using an insulating film having a high dielectric constant. One method is a sputtering method. FIG. 11 illustrates a schematic representation of the high dielectric constant insulating film by a sputtering method. The sputtering method is explained for the case of forming a $ZrO_2$ film. In a reaction chamber 61, a silicon substrate 62, which is to be deposited, is placed on a susceptor 63 and a Zr target is arranged above the susceptor 63 facing the silicon substrate 62.

In the above arrangement, when plasma 65 is generated in the reaction chamber 61 retained in an atmosphere including oxygen (oxidizing gas) at a desired pressure, plasma ions advance toward the direction of an arrow 66 and impinge the Zr target 64. The impinging ions recoil zirconium ions from the target toward the direction of an arrow 67, the zirconium ions react with surrounding oxygen to form zirconium oxide ($ZrO_2$), and the zirconium oxide is deposited on the silicon substrate 62 forming a film.

Figure 12:
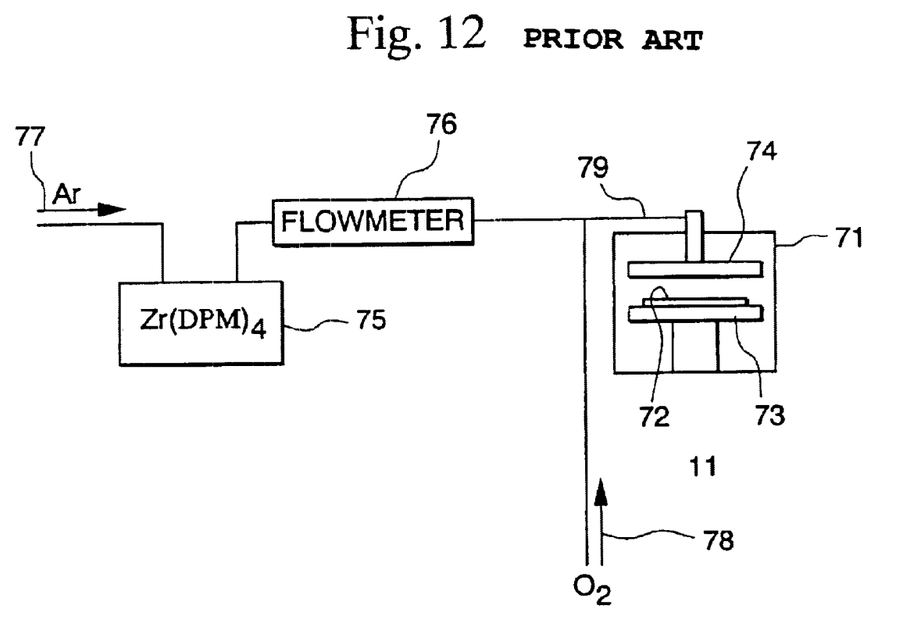
FIG. 12 is a schematic representation showing a conventional method of forming a high dielectric constant insulating film by a CVD method in the manufacturing process of a semiconductor device.

Another method for forming the zirconium oxide film is to apply a CVD method. FIG. 12 illustrates a schematic representation of forming a high dielectric constant insulating film by the CVD method. A method for forming a $ZrO_2$ film is described below as an example of forming the high dielectric constant insulating film. In a reaction chamber 71, a silicon substrate 72 for depositing the film is placed on a susceptor 73 and a showerhead 74 is arranged above the susceptor 73 facing the silicon substrate 72. The CVD system is constituted such that a metal organic (MO) material 75 containing zirconium such as $Zr(DPM)_4$, and a flow-meter (mass flow meter) are provided at the outside of the reaction chamber 71, and the thus formed vaporized organic metallic materials and oxygen (oxidizing gas) as the oxidizing agent 78 are introduced into the reaction chamber 71 with an Ar carrier gas 77 through a gas introduction passage 79 from the showerhead.

Using the above-described constitution, the vaporized organic metal material 75 and oxygen gas 78 is carried by the Ar carrier gas 77 and introduced into the reaction chamber 71, while the reaction chamber is maintained at a desired temperature and a desired pressure. In the reaction chamber, the organic metal material 75 is decomposed into metal zirconium and zirconium oxide is formed by the reaction between the metal zirconium and oxygen and deposited on the silicon substrate. A semiconductor device is manufactured using of this zirconium oxide film as the gate insulating film having a high dielectric constant.

However, a problem arises in the above-described semiconductor devices formed by conventional manufacturing methods, such as the sputtering method or the CVD method, in that the performance of these semiconductor devices are degraded. The degradation of the performances of the semiconductor devices is caused by the oxidizing gas used in the conventional manufacturing methods, since the oxidizing gas forms a silicon oxide film having a low dielectric constant in between the gate insulating film having a high dielectric constant and the silicon substrate.

That is, when the oxidizing gas is used for forming the high dielectric constant insulating film by the sputtering method or the CVD method, the oxygen gas used as the oxidizing gas oxidizes the surface of the silicon substrate. As a result, as shown in FIG. 10, in the semiconductor device manufactured by the above method, a silicon oxide film is formed between the high dielectric constant gate insulating film 70 and the silicon substrate 51.

Figure 10:
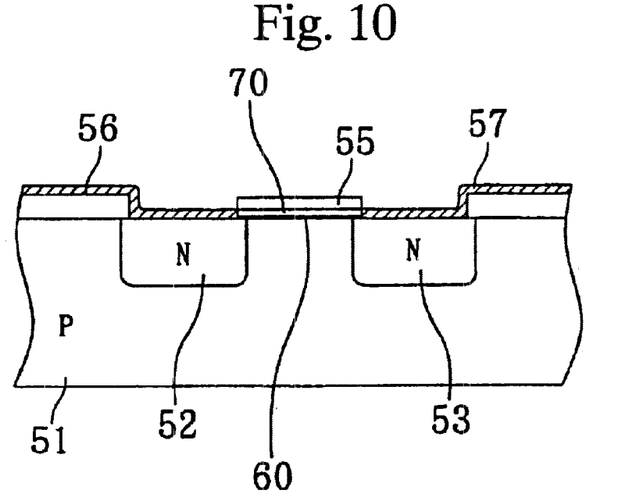
FIG. 10 is a cross-sectional diagram showing a defect of the semiconductor device manufactured by the manufacturing method according to the second embodiment of the present invention.

As shown in the semiconductor device in FIG. 10, since the gate insulating film 70 having a high dielectric constant (for example, $ZrO_2$ film: the dielectric constant is 10 to 25) is formed on the silicon oxide film 60 (dielectric constant is 3.8 to 4.1) on the silicon substrate 51, the gate insulating film is substantially composed of these two insulating films 70 and 60. Accordingly, as is clear from the above Equation (2), the capacitance of the gate insulating film in this case decreases, and an increase in the drain current Id is hindered so that high performance of the semiconductor device is not obtainable.

SUMMARY OF THE INVENTION

The present invention was made in order to solve the above-described problems. The object of the present invention is therefore to provide a method for manufacturing a semiconductor device having a high dielectric constant gate insulating film made of a metal oxide formed on a silicon substrate.

According to the first aspect, the manufacturing method comprises the steps of placing the silicon substrate into a reaction chamber, introducing an organic metal material, an oxidizing agent, and a material having a reducing action, and forming a high dielectric constant gate insulating film on the silicon substrate by generating a chemical reaction in the reaction chamber.

According to the second aspect of the present invention, in the method for manufacturing the semiconductor device according to the first aspect, the oxidizing gas and the material gas having a reducing action are first introduced into the reaction chamber, and, shortly thereafter, the organic metal material is introduced into the reaction chamber.

According to the third aspect of the present invention, the method for manufacturing a semiconductor device provided with a high dielectric constant gate insulating film made of a metal oxide formed on the semiconductor substrate comprises the steps of: forming a plurality of active regions in an element separating region for forming an MIS-type semiconductor device in each active region; forming a high dielectric constant insulating film on a semiconductor substrate using a CVD method by a chemical reaction of an organic metal material containing a metal for forming a metal oxide, an oxidizing agent, and a material having a reducing action; patterning, after forming a conductive layer on the high dielectric constant insulating film, the high dielectric constant insulating film and the conductive layer for forming the gate insulating film made of the high dielectric constant insulating film and a gate electrode made of the conductive layer, and forming the MIS-type transistors by forming a source and drain regions by ion implantation of a desired conductivity type impurity into the active regions using each gate electrode as a mask.

According to the fourth aspect of the present invention, in the method for manufacturing a semiconductor device according to the first aspect, the thickness of the high dielectric constant insulating film is determined by the magnitude of the dielectric constant of the high dielectric constant insulating film.

According to the fifth aspect of the present invention, in the method for manufacturing a semiconductor device according to the fourth aspect, a thicker high dielectric constant insulating film is formed when the high dielectric constant insulating film has a higher dielectric constant.

According to the sixth aspect of the present invention, in the method for manufacturing a semiconductor device according to the first aspect, THF (tetrahydrofuran) is used as the material having a reducing action.

According to the seventh aspect of the present invention, in the method for manufacturing a semiconductor device according to the first aspect, wherein the metal oxide is selected from the group of metal oxides consisting of $ZrO_2$ (zirconium oxide), $HfO_2$ (hafnium oxide), $Al_2O_3$ (aluminum oxide), BST ($(Ba, Sr)TiO_2$), $Ta_2O_5$ (tantalum oxide), and $TiO_2$ (titanium oxide).

According to the eighth aspect of the present invention, in the method for manufacturing a semiconductor device according to the first aspect, the semiconductor substrate is made of silicon.

According to the ninth aspect of the present invention, a semiconductor device, in which a plurality of active regions are formed in an element separating region formed in a semiconductor substrate, and each active region has a high dielectric constant gate insulating film made of a metal oxide, comprises: the high dielectric constant gate insulating film which is constituted by a high dielectric constant insulating film formed by a chemical reaction of an organic metal material including a metal for forming a metal oxide, an oxidizing agent, and a material having a reducing action.

According to the tenth aspect of the present invention, in a semiconductor device according to the ninth aspect, the metal oxide is selected from the group of metal oxides consisting of $ZrO_2$ (zirconium oxide), $HfO_2$ (hafnium oxide), $Al_2O_3$ (aluminum oxide), BST ($(Ba, Sr)TiO_2$), $Ta_2O_5$ (tantalum oxide), and $TiO_2$ (titanium oxide).

According to the eleventh aspect of the present invention, in a semiconductor device according to the ninth aspect, the semiconductor substrate is made of silicon.

DETAILED DESCRIPTION OF THE INVENTION

Hereinafter, embodiments of the present invention are described with reference to the attached drawings.

First Embodiment

Figure 1A:
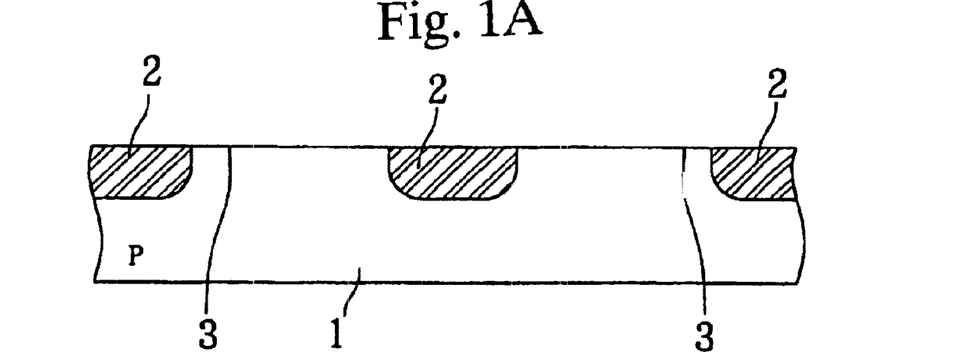
FIGS. 1A to 1C are diagrams showing sequential manufacturing processes of a semiconductor device according to the first embodiment of the present invention.
Figure 1B:
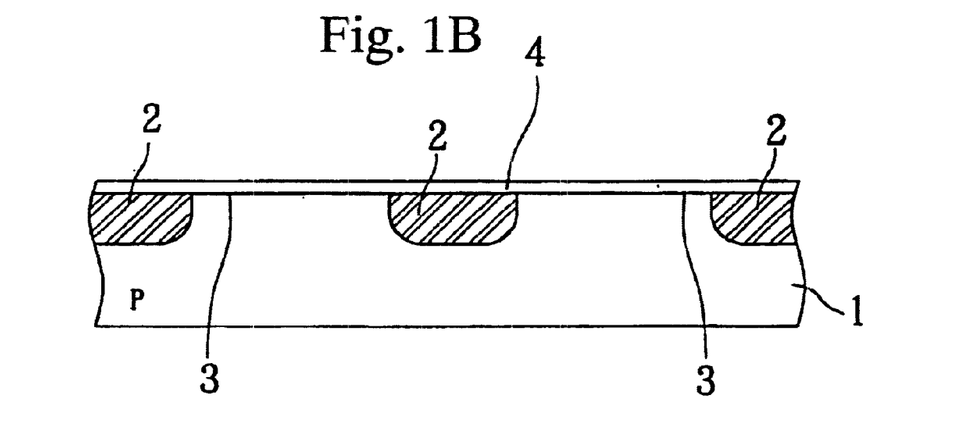
Figure 1C:
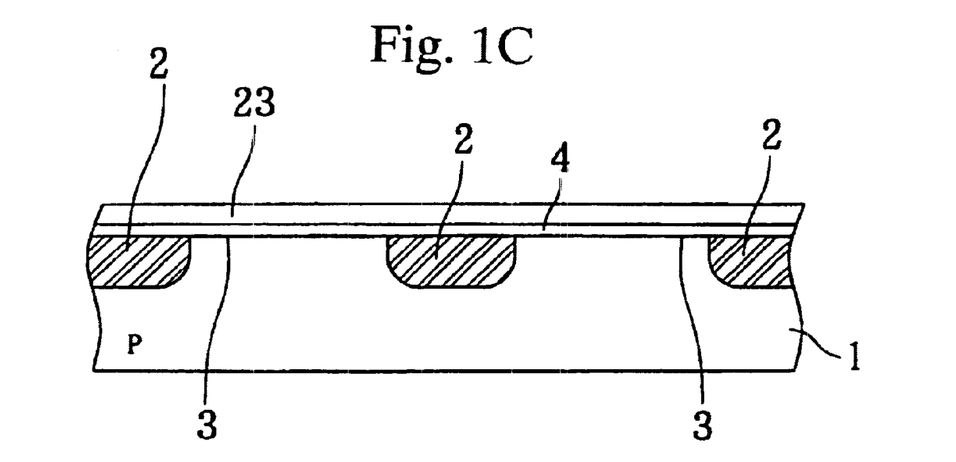
Figure 2D:
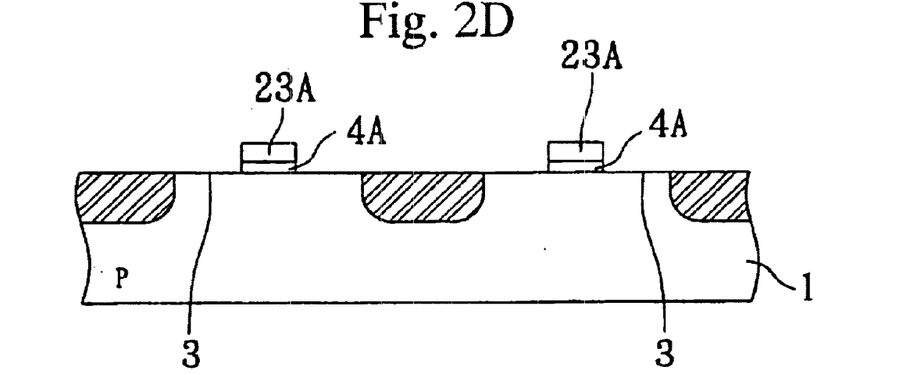
FIGS. 2D to 2F are diagrams showing the continuing sequential manufacturing processes of the semiconductor device according to the first embodiment.
Figure 2E:
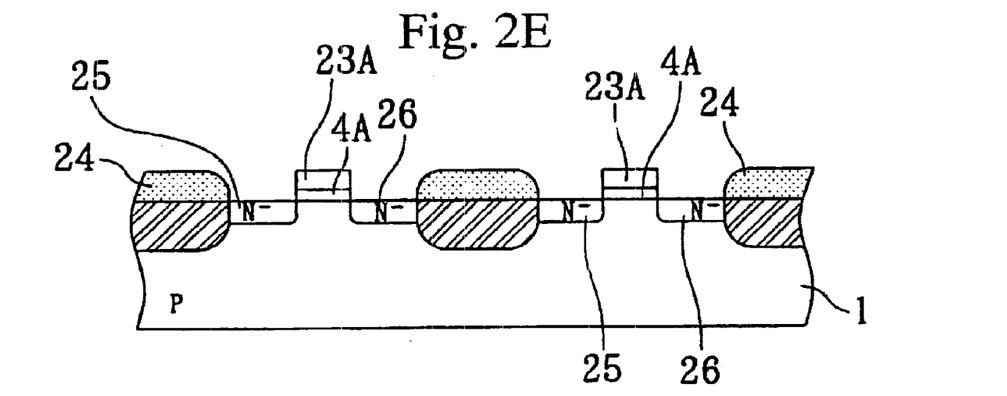
Figure 2F:
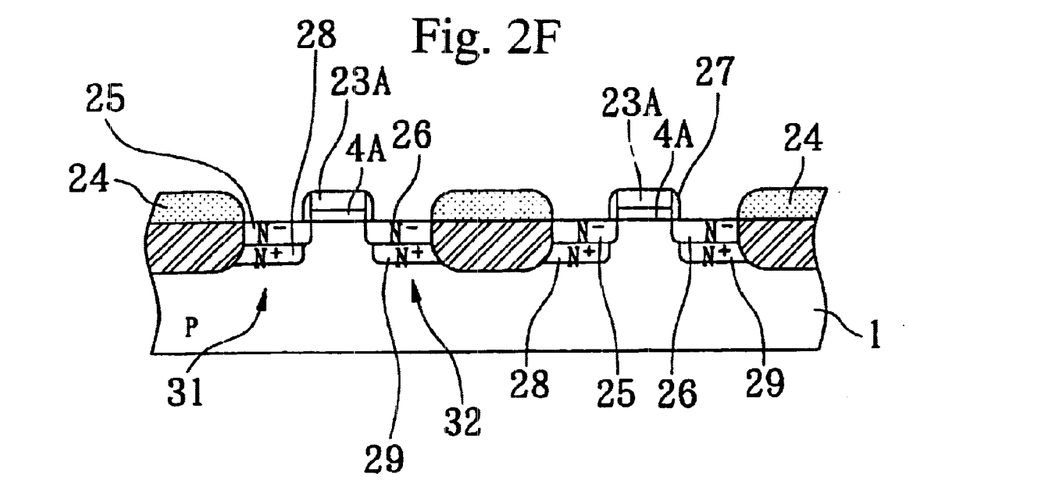
Figure 3G:
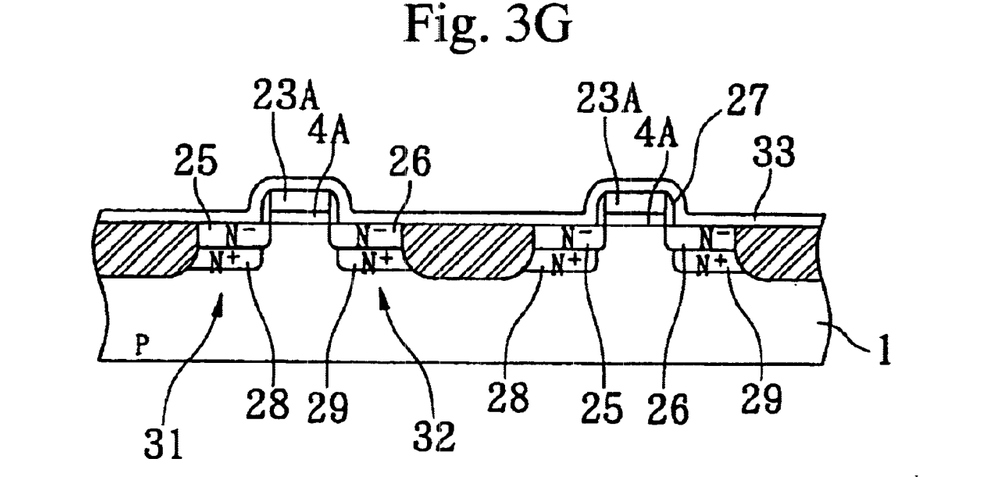
FIGS. 3G and 3H are diagrams showing continuing sequential of the manufacturing processes of the semiconductor device according to the first embodiment.
Figure 3H:
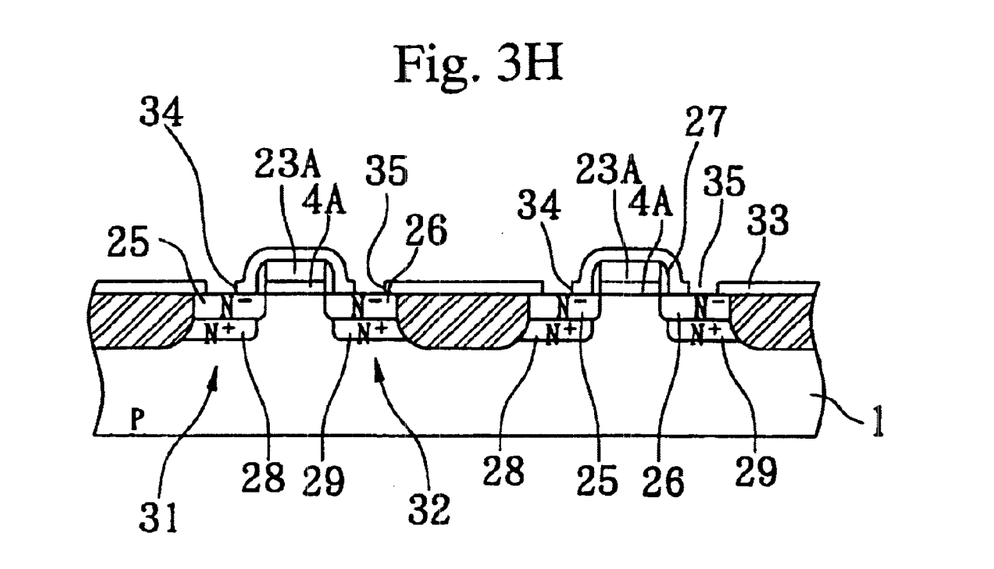
Figure 4:
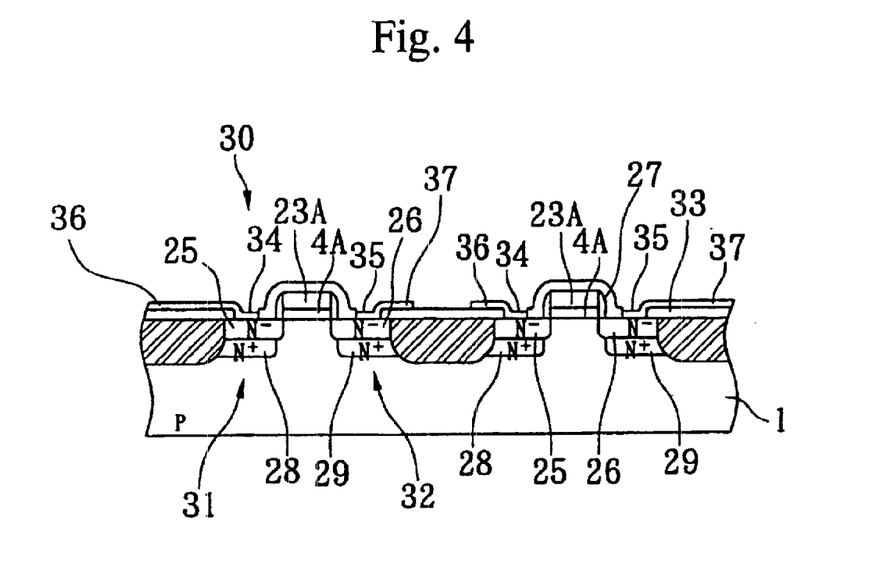
FIG. 4 is a cross-sectional view showing the structure of a semiconductor device manufactured by the manufacturing method of the semiconductor device according to the first embodiment.
Figure 5:
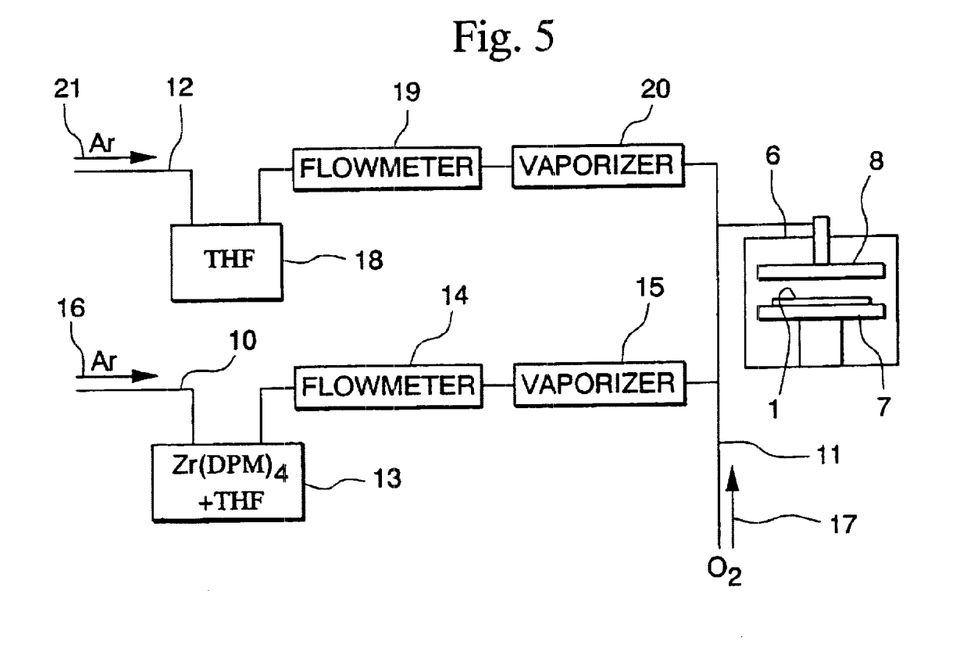
FIG. 5 is a diagram showing a method for forming a high dielectric constant insulating film by a CVD method in the manufacturing method of the semiconductor according to the first embodiment.
Figure 6:
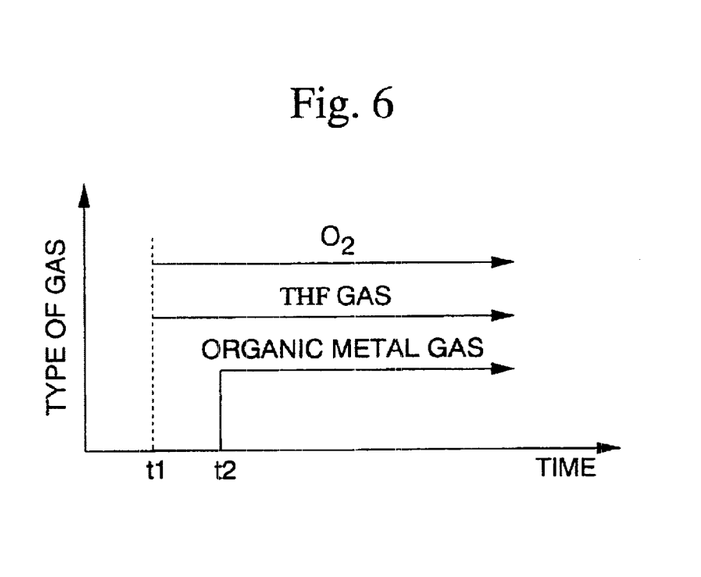
FIG. 6 is a time-chart showing a sequence of the forming method of a high dielectric constant insulating film according to the first embodiment.

FIGS. 1 to 3 are diagrams showing the sequential manufacturing processes of the semiconductor according to the first embodiment of the present invention; FIG. 4 shows a cross-sectional view of the semiconductor device manufactured by the process according to the first embodiment; FIG. 5 is a schematic representation of the manufacturing method of the high dielectric constant insulating film by a CVD method in the manufacturing method of the semiconductor device according to the first embodiment, and FIG. 6 is a time chart showing the sequence of the manufacturing method of the high dielectric constant insulating film in the manufacturing process of the semiconductor device according to the first embodiment. Below, the manufacturing method of this semiconductor device is explained in sequence with reference to FIGS. 1 to 3.

First, as shown in FIG. 1A, an element separating region 2 is selectively formed on the P-type silicon substrate 1 by known methods such as LOCOS (Local Oxidation of Silicon) or STI (Shallow Trench Isolation). Thereby, the element separating region 2 defines a plurality of active regions 3, on which MIS-type transistors are formed respectively. A thin naturally oxidized oxide film (not shown in the figure) is formed on the surface of each active region.

Next, as shown in FIG. 1B, a $ZrO_2$ film 4 having a thickness of 2 to 10 nm is formed as the high dielectric constant insulating film by CVD (Chemical Vapor Deposition). As described later, the insulating film 4 is subjected to a patterning process and made into a desired shape for forming the gate insulating film.

Hereinafter, a method for forming the $ZrO_2$ film by CVD is described with reference to FIG. 5.

As shown in FIG. 5, the reaction chamber of the CVD apparatus is held at a pressure in the range of 13.3 to 13300 Pa and a silicon substrate 1 to be processed is placed on a susceptor 7 which is held at a temperature ranging from 200 to 500° C. The silicon substrate is placed in the reaction chamber 6 after the naturally oxidized oxide film formed on the silicon substrate is removed in advance by an etching solution such as DHF (Diluted Hydrofluoric Acid). A showerhead 8 is disposed above the susceptor 7 facing the silicon substrate 1.

At the outside of the reaction chamber 6, a first gas introduction passage 10 for introducing an organic metal material containing Zr, a second gas introduction passage 11 for introducing oxygen as the oxidizing agent, and a third gas introduction passage 12 for introducing a material having a reducing action 12 are provided.

A solution containing an organic metal material 13 containing Zr, such as $Zr(DPM (C_{11}H_{19}O_2))_4$ is vaporized by a vaporizer 15 and this organic metal material vapor 13 dissolved in THF (tetrahydrofuran) is introduced with an Ar carrier gas into the reaction chamber 6 through a gas flowmeter 14. $Zr(DPM)_4$ is a solid at ordinary temperatures and this material is used after vaporization by heating to more than the sublimation temperature of 182° C. and by dissolution in THF which is liquid at ordinary temperatures.

Oxygen as the oxidizing agent is introduced into the reaction chamber through the second gas introduction passage 11. A material having a reducing action such as THF, which is a liquid at ordinary temperatures is vaporized by a vaporizer 20, and this organic metal material vapor 13 is introduced with an Ar carrier gas 21 from the showerhead 8 into the reaction chamber 6.

As shown in the time-chart of FIG. 6, at time t1, oxygen 17 is introduced through the second gas introduction passage 11 at a flow rate of 1 to 20 sccm (standard cubic centimeters per minute) and THF vapor 18 is introduced through the third gas introduction passage 12 from the showerhead 8 by being carried by the Ar carrier gas 21 while introducing the Ar carrier gas 21 at a flow rate of 10 to 500 sccm. Subsequently, at time t2 shortly after time t1, the organic metal material vapor 13 of $Zr(DPM)_4$ dissolved in the THF vapor 18 is introduced into the reaction chamber through the first gas introduction passage 10 from the showerhead 8 by being carried by the Ar carrier gas 21 while introducing the Ar carrier gas 21 at a flow rate of 10 to 500 sccm.

As a result of chemical reactions in the reaction chamber 6, a $ZrO_2$ film 4 is formed on the silicon substrate 1 by the reaction of Zr, formed by decomposition of the organic metal material vapor, with oxygen, as shown in FIG. 1B. It is noted that, when the $ZrO_2$ film 4 is formed by the method shown in FIG. 5, a $ZrO_2$ film having a thickness of 2 to 10 nm is formed by a reaction lasting for 10 to 100 seconds.

According to the present embodiment, since oxygen 17 as the oxidizing agent is introduced through the second gas introduction passage 11 and at the same time, the THF vapor 18 as the reducing gas is introduced through the third gas introduction passage 12 into the reaction chamber 6, the oxidization of the surface of the silicon substrate 1 by oxygen 17 at the time of forming the $ZrO_2$ film can be prevented by the reducing action of the THF vapor 18. In addition, as shown in the time chart of FIG. 6, since the introduction of the organic metal material vapor 13 of $Zr(DPM)_4$ dissolved in the THF vapor through the first gas introduction passage 10 is delayed until after the introduction of the THF vapor 18 through the third gas introduction passage 12, the surface of the silicon substrate is reduced effectively, and it becomes possible to completely eliminate the formation of a silicon oxide film having a low dielectric constant on the surface of the silicon substrate 1.

According to the first embodiment of the manufacturing method of this semiconductor device of the present invention, it is possible to obtain a gate insulating film which has a thickness sufficient for reducing or eliminating the generation of the above-described gate leak current, which provides a key factor for improving the performance of the semiconductor device.

Next, a polycrystalline silicon film 23 having a thickness of 50 to 100 μm is formed on the $ZrO_2$ film 4 by CVD, as shown in FIG. 1C.

Subsequently, as shown in FIG. 2D, the $ZrO_2$ film 4 and the polycrystalline silicon film 23 are etched into a desired pattern by known photolithographic technology, and thus, a gate insulating film 4A made of the $ZrO_2$ film 4 and a gate electrode 23A made of the polycrystalline silicon film 23 are formed at an approximate center portion of the active region 23.

Subsequently, as shown in FIG. 2E, after covering the substrate surface, excluding the active region 3 with a photoresist film 24, the active region is ion implanted using a N-type impurity such as phosphorus (P) in a self-aligning manner. Subsequently, the silicon substrate is annealed and N-type source regions 25 and drain regions 26 are then formed.

Subsequently, as shown in FIG. 2F, after a side wall insulating film 27 is formed using an insulating material such as silicon oxide so as to cover the side surfaces of the gate insulating film 4A and the gate electrode 23A, a P-type impurity such as arsenic (As) is ion implanted into the active region 3 in a self-aligning manner using the gate electrode 23 and the side wall film 27 as the self aligning mask. Subsequently, the substrate is annealed and $N^+$ type source regions 28 and drain regions 29 are formed so as to overlap the $N^-$ type source regions 25 and drain regions 26 and at deeper positions from the substrate surface than the positions of the $N^-$ type source regions 25 and drain regions 26. The $N^-$ type source 25 and drain regions 26 are only present just beneath the side-wall insulating film 27. Consequently, N-type source regions 31 and drain regions 32 of what is called the LDD (Lightly Doped Drain) structure are formed in the active region.

Subsequently, as shown in FIG. 3G, an interlayer insulating film 33 having a thickness of 0.5 to 0.8 μm is formed by CVD on the entire surface of the substrate. Subsequently, contact holes 34 and 35 are formed respectively so as to expose the N-type source regions 31 and drain regions 32 by patterning the interlayer insulating film using photolithography.

A source electrode 36 and a drain electrode 37 are formed by filling metallic materials such as Al or Cu into the contact holes in respective N-type source regions 31 and drain regions 32, and consequently, the semiconductor device 30 comprising the gate insulating film 4A made of $ZrO_2$ is obtained.

As shown in FIG. 4, the semiconductor device manufactured by the manufacturing method according to the present embodiment includes an MIS type transistor comprising a gate electrode 23A formed through the gate insulating film 4A made of $ZrO_2$ 4 on the silicon substrate between the N-type source regions 31 and drain regions 32 in the active region 3.

As described above, since the above-described semiconductor device 30 comprises a high dielectric constant gate insulating film made of $ZrO_2$ 4, which is formed by the chemical reaction of the organic metal material 13 containing Zr for forming the zirconium oxide, oxygen 17 as the oxidizing agent, and the THF vapor 18 as a reducing material having a reducing action, the high dielectric constant of the gate insulating film makes it possible to form a thick gate insulating film so as to eliminate or reduce the generation of the leak current, which results in improving the performance of this type of semiconductor device.

As described above, according to the manufacturing method of this type of semiconductor device, the gate insulating film 4A having a high dielectric constant made of $ZrO_2$ is formed in sequence by first carrying a silicon substrate 1 into the reaction chamber 6, subsequently the organic metal material 13 containing Zr metal for forming the zirconium oxide, the oxygen gas 17 as the oxidizing agent, and the THF vapor 18 as a material having a reducing action are introduced into the reaction chamber; subsequently a chemical reaction is induced for forming the $ZrO_2$ film 4 and the gate insulating film 4A is formed by processing the $ZrO_2$ film 4. Accordingly, since it is possible to form a gate insulating film having a thickness capable of preventing or reducing the generation of the gate leak current, the performance of the semiconductor device can be improved.

Furthermore, since this type of semiconductor device has a gate insulating film 4A made of an insulating film 4 having a high dielectric constant, which is formed by the chemical reaction using of the organic metal material vapor 13 including the zirconium metal, the oxygen gas 17 as the oxidizing agent, and the THF vapor 18 having the reducing action, the performance and the reliability of this type of semiconductor device can be improved.

As described above, the feature of the manufacturing method of this type of semiconductor device according to the present embodiment is that, since the surface of the silicon substrate is not oxidized even though an oxidizing gas is present at the time of forming the insulating film having a high dielectric constant, the gate insulating film 4A can be made directly on the silicon substrate.

Second Embodiment

Figure 7:
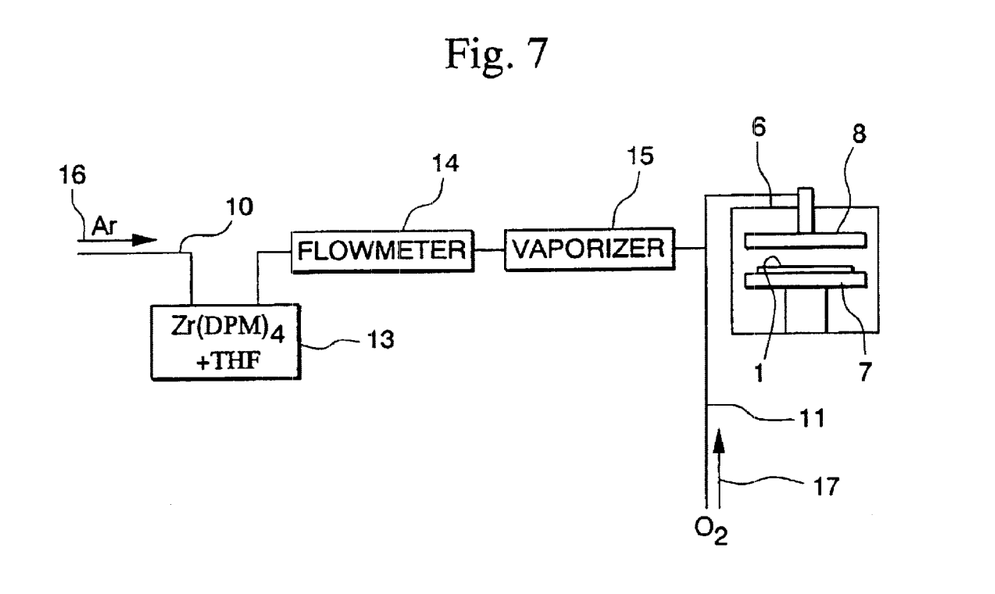
FIG. 7 is a diagram showing a method of forming a high dielectric constant insulating film in a manufacturing method of a semiconductor device according to the second embodiment of the present invention.

FIG. 7 is a diagram schematically showing the manufacturing method of the insulating film having a high dielectric constant by CVD in manufacturing the semiconductor device according to the second embodiment of the present invention. The manufacturing method of the semiconductor device according to the second embodiment differs from that of the first embodiment in that the introduction tube for introducing the reducing material having a reducing action is omitted.

In this embodiment, as shown in FIG. 7, the gas reaction system is constituted such that the third gas introduction passage 12 is omitted, and the reducing material gas 18 such as THF is introduced into the reaction chamber 6 together with the organic metal material 13 through the first gas introduction passage 10.

Figure 8:
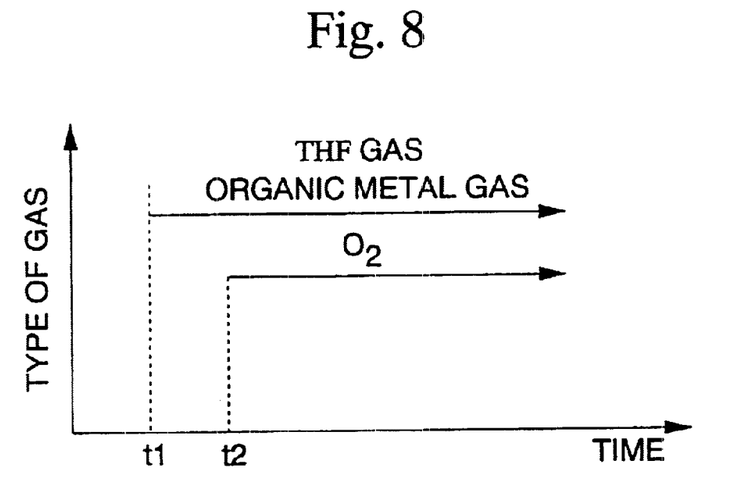
FIG. 8 is a time-chart showing the method of forming a high dielectric constant insulating film according to the second embodiment.

In the present embodiment, the reducing action is obtained by introducing THF used as a solvent for dissolving the organic metal material such as $Zr(DPM)_4$ In the above constitution, as shown in the time chart of FIG. 8, at time t1, the Ar carrier gas 16 is introduced while carrying the organic metal material 13 of $Zr(DPM)_4$, dissolved in THF, into the reaction chamber through the first gas introduction passage 10 from the showerhead 8. At time t2, shortly after time t1, the oxygen gas 17 as the oxidizing agent is introduced through the second gas introduction passage 11 from the showerhead 8 into the reaction chamber 6. The flow rates of the respective gases are determined according to those used in the first embodiment.

In this embodiment, since the gas mixture of the organic metal material 13 and the reducing gas of THF is introduced through the first gas introduction passage 10 before introducing the oxidizing agent of oxygen gas 17 through the second gas introduction passage 11, the silicon substrate surface is protected from oxidization due to the reducing action of THF.

Except for the above modification, since the constitution of the present embodiment is the same as that of the first embodiment, the components in FIG. 7, which are similar to those in FIG. 5 are denoted by the same reference numerals, and their explanations are omitted.

As described above, the second embodiment exhibits similar effects to those of the first embodiment. In addition, since one gas introduction passage is omitted, the constitution of the gas introduction system for forming the insulating film having a high dielectric constant can be simplified.

As described above, the present invention is described in detail with reference to the attached drawings. However, the present invention is not limited to the two embodiments described above, but variants thereof can be envisaged which do not exceed the scope of the invention. For example, the high dielectric constant insulating film is not limited to only an insulating film made of $ZrO_2$ but other insulating films having a high dielectric constant can be used. Some examples of metal oxides used for forming the gate insulating films are tabulated in Table 1.

TABLE 1

| Type of insulating film | Examples of MO materials | Solid or liquid at room temperature | Materials having reducing action |
|---|---|---|---|
| $Al_2O_3$ ($\epsilon$: 6.0 to 10) | $Al(CH_3)_3$ | liquid | THF |
| $Al_2O_3$ ($\epsilon$: 6.0 to 10) | $AlCl_3$ | solid (190° C.) | THF |
| $ZrO_2$ ($\epsilon$: 10 to 25) | $Zr(DPH)_4$ | solid (182° C.) | THF |
| $Ta_2O_5$ ($\epsilon$: 20 to 40) | $Ta(O-C_2H_5)_5$ | liquid | THF |
| BST ($\epsilon$: 50 to 200) | $Ba(DPH)_2$ | solid (217° C.) | THF |
| BST ($\epsilon$: 50 to 200) | $Sr(DPH)_2$ | solid (210° C.) | THF |
| BST ($\epsilon$: 50 to 200) | $Ti(O-i-C_3H_7)_2(DPH)_2$ | solid (172° C.) | THF |
| $TiO_2$ ($\epsilon$: 20 to 50) | $Ba(DPH)_2$ | solid (217° C.) | THF |
| $TiO_2$ ($\epsilon$: 20 to 50) | $Sr(DPH)_2$ | solid (210° C.) | THF |
| $TiO_2$ ($\epsilon$: 20 to 50) | $Ti(O-i-C_3H_7)_2(DPH)_2$ | solid (172° C.) | THF |

Although not shown in Table 1, $HfO_2$ (hafnium oxide, dielectric constant $\epsilon$:10 to 30) is one of excellent materials for forming the insulating film having a high dielectric constant.

When such a material selected from Table 1 are used in place of $ZrO_2$, it is preferable to select a thicker film when the dielectric constant of the material is higher. This is because the insulating film with a higher dielectric constant is liable to generate the leak current (the band gap is small). If the insulating film having a high dielectric constant is formed as a thick film, the capacitance of the gate insulating film does not change. Therefore, the thickness of the gate insulating film will not affect the performance of the semiconductor device.

Although a description is provided for the MIS type transistor comprising the high insulating film having a high dielectric constant, the semiconductor device is not limited to the MIS type transistor. The conduction types of the silicon substrate and the semiconductor regions are not limited to those shown in the above embodiment, and the conduction types of the P- and N-types can be reversed. In addition, the type, film thickness, and film forming method described are as one example, and these can be modified according to the purpose and the use.

As described above, according to the manufacturing method of this type of semiconductor device, the gate insulating film 4A having a high dielectric constant made of $ZrO_2$ is formed in sequence by first carrying a silicon substrate 1 into the reaction chamber 6; subsequently, the organic metal material 13 containing Zr metal for forming the zirconium oxide, the oxygen gas 17 as the oxidizing agent, and the THF vapor 18 as a material having a reducing action are introduced into the reaction chamber; subsequently, a chemical reaction is induced for forming the $ZrO_2$ film 4 and the gate insulating film 4A is formed by processing the $ZrO_2$ film 4. Accordingly, since it is possible to form the gate insulating film having a thickness capable of preventing or reducing the generation of the gate leak current, the performance of the semiconductor device can be improved.

The semiconductor device of this type of constitution comprises a gate insulating film made of a metal oxide formed by the chemical reaction of the organic metal material, the oxidizing agent, and the material having a reducing action, and therefore the performance and the reliability of the semiconductor device can be improved.

The feature of the present invention is that an insulating film having a high dielectric constant can be formed directly on the silicon substrate by the addition of a reducing agent in the gas system for the chemical reaction even though an oxidizing agent is present in the gas system.

What is claimed is:

1. A method of making a metal oxide gate insulating film on a silicon substrate in a semiconductor device, the method comprising the steps of:

removing a native silicon oxide film from a first surface of the silicon substrate on which the metal oxide gate insulating film is to be formed; and after placing the silicon substrate in a reaction chamber, simultaneously introducing oxygen and a gaseous reducing agent into the reaction chamber at a first time, thereby preventing formation of another silicon oxide film on the first surface of the silicon substrate, and introducing an organic metal gas into the reaction chamber at a second time after the first time, so as to form the metal oxide gate insulating film directly on the first surface of the silicon substrate, without a silicon oxide film between the metal oxide gate insulating film and the silicon substrate.

2. The method of claim 1, wherein the reducing agent is tetrahydrofuran (THF).

3. The method of claim 2, wherein the organic metal gas is $Zr(DPM)_4$.

4. The method of claim 1, wherein the metal oxide insulating film is selected from the group of metal oxides consisting of $ZrO_2$ (zirconium oxide), $HfO_2$ (hafnium oxide), $Al_2O_3$ (aluminum oxide), BST ((Ba, Sr)$TiO_2$), $Ta_2O_5$ (tantalum oxide), and $TiO_2$ (titanium oxide).

5. A method of making a metal oxide gate insulating film on a silicon substrate in a semiconductor device, the method comprising the steps of:

removing a native silicon oxide film from a first surface of the silicon substrate on which the metal oxide gate insulating film is to be formed; and after placing the silicon substrate in a reaction chamber, simultaneously introducing an organic metal gas and a gaseous reducing agent into the reaction chamber at a first time, thereby preventing formation of another silicon oxide film on the first surface of the silicon substrate, and introducing oxygen into the reaction chamber at a second time after the first time, so as to form the metal oxide gate insulating film directly on the first surface of the silicon substrate, without a silicon oxide film between the metal oxide gate insulating film and the silicon substrate.

6. The method of claim 5, wherein the reducing agent is tetrahydrofuran (THF).

7. The method of claim 6, wherein the organic metal gas is $Zr(DPM)_4$.

8. The method of claim 5, wherein the metal oxide insulating film is selected from the group of metal oxides consisting of $ZrO_2$ (zirconium oxide), $HfO_2$ (hafnium oxide), $Al_2O_3$ (aluminum oxide), BST ($(Ba, Sr)TiO_2$), $Ta_2O_5$ (tantalum oxide), and $TiO_2$ (titanium oxide).

9. A method of making a metal oxide gate insulating film on a silicon substrate in a semiconductor device, the method comprising the steps of:

removing a native silicon oxide film from a first surface of the silicon substrate on which the metal oxide gate insulating film is to be formed; and after placing the silicon substrate in a reaction chamber, introducing a reducing gas into the reaction chamber at a first time to prevent formation of another silicon oxide film on the first surface of the silicon substrate and introducing an oxidizing gas and an organic metal gas into the reaction chamber simultaneously at a second time after the first time, so as to form the metal oxide gate insulating film directly on the first surface of the silicon substrate without forming a silicon oxide film between the metal oxide gate insulating film and the first surface of the silicon substrate.

10. The method of claim 9, wherein the reducing agent is tetrahydrofuran (THF).

11. The method of claim 10, wherein the organic metal gas is $Zr(DPM)_4$.

12. The method of claim 9, wherein the metal oxide insulating film is selected from the group of metal oxides consisting of $ZrO_2$ (zirconium oxide), $HfO_2$ (hafnium oxide), $Al_2O_3$ (aluminum oxide), BST ($(Ba, Sr)TiO_2$), $Ta_2O_5$ (tantalum oxide), and $TiO_2$ (titanium oxide).

* * * * *